US006625424B1

United States Patent
Mohindra

(10) Patent No.: US 6,625,424 B1
(45) Date of Patent: Sep. 23, 2003

(54) AUTOCALIBRATION OF A TRANSCEIVER THROUGH NULLING OF A DC-VOLTAGE IN A RECEIVER AND INJECTING OF DC-SIGNALS IN A TRANSMITTER

(75) Inventor: Rishi Mohindra, Milpitas, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/531,944

(22) Filed: Mar. 21, 2000

(51) Int. Cl.[7] .................................. H04B 1/38
(52) U.S. Cl. .................. 455/84; 455/82; 455/87
(58) Field of Search ...................... 455/431, 204, 455/192.2, 83, 115, 76, 84, 324, 78, 82, 86, 225, 24, 560, 71, 114, 113, 315, 118, 77; 375/279

(56) References Cited

U.S. PATENT DOCUMENTS

| | | | | |
|---|---|---|---|---|
| 4,717,894 A | | 1/1988 | Edwards et al. ............ 332/20 |
| 5,715,281 A | * | 2/1998 | Bly et al. ............ 375/344 |
| 5,901,344 A | * | 5/1999 | Opas ............ 455/76 |
| 6,154,640 A | * | 11/2000 | Itoh et al. ............ 455/76 |
| 6,185,260 B1 | * | 2/2001 | Ishiii ............ 375/279 |

* cited by examiner

Primary Examiner—Edward F. Urban
Assistant Examiner—Naghmeh Mehrpour
(74) Attorney, Agent, or Firm—Theodouis Mak

(57) ABSTRACT

A quadrature tranceiver has a transmitter, a receiver, and a common local oscillator. With the transmitter switched off and the receiver switched on, a DC-error in the receiver is nulled in servo loops in in-phase and a quadrature receiver paths. After settling, the servo loops provide output values that are freed of the DC-error. DC-nulling output values are then sampled and stored. After sampling, the servo loops are opened. Thereafter, the transmitter is switched on while inputting a fixed signal to the transmitter, and DC-signals injected into in-phase and quadrature paths of the transmitter are adjusted until the opened servo loops provide the same output signal as obtained at the end of the DC-nulling. Corresponding values of the injected DC-signals are then stored as transmitter calibration values.

19 Claims, 3 Drawing Sheets

AUTOCALIBRATION OF A TRANSCEIVER THROUGH NULLING OF A DC-VOLTAGE IN A RECEIVER AND INJECTING OF DC-SIGNALS IN A TRANSMITTER

BACKGROUND OF THE INVENTION

1. Field of the Invention

The present invention relates to a transceiver, more particularly to carrier leakage compensation in a transmit branch of a time division duplex transceiver that has a common local oscillator for the transmit branch and the receive branch of the transceiver. Such a transceiver can be a transceiver operating in the so-called 2.4 GHz ISM band, or any other suitable transceiver.

2. Description of the Related Art

In the U.S. Pat. No. 4,717,894 calibration of a vector modulator is disclosed using a scalar detector to measure the amplitude of an RF output signal of a transmitter. Calibration is done to compensate errors in vector modulated signals such as errors caused by carrier leakage, amplitude imbalance of the I and Q channels, and a quadrature phase error. Carrier leakage is the appearance of an output signal from the quadrature mixers even when the modulation inputs are grounded and can be caused by a non-zero offset voltage in a mixer, capacitive or inductive coupling of the LO signal across the mixer, and impedance mismatches at the mixer ports. Calibration measurements are made using a detector to measure the amplitude of the RF output signal. DC signal sources provide reference signals for the I and Q modulation inputs, when connected by switches to mixers and in place of the I and Q modulation signals. Other DC sources provide carrier leakage compensation signals for the I and Q signal components, respectively. A signal source, which can be selectively connected to either the I or Q input lines by switches provides calibration signals for balancing the I and Q amplitude. Both phase and amplitude errors are corrected, and carrier leakage is minimized. The carrier leakage is minimized by adjusting the DC sources for carrier leakage compensation to minimize the RF output when the modulation inputs are grounded. For calibrating the vector modulator thus a power detector is needed to measure the RF power of the transmitter. Such a power detector renders the vector modulator more complicated and expensive.

In time division duplexing transceivers, in order to reduce cost, it is desirable to have a common local oscillator for the transmitter and the receiver. Furthermore, in order to achieve a short transmit-receive turn-around time, the same synthesizer based local oscillator frequency should be used for the transmitter and the receiver. Moreover, in order to be able to integrate receive channel filters, or to produce transmitter base band I and Q signals via digital-to-analog converters while applying a low sampling rate, the intermediate frequency should be kept low with respect to the radio frequency. Particularly when such a common-LO and low-IF transceiver operates at a microwave frequency range, e.g. at a 2.4 GHz ISM band, an uncalibrated transceiver has considerable carrier leakage in the transmitter. With a zero-IF or low-IF frequency, the carrier leakage frequency falls within the transmission band and thus cannot be removed by the transmitter of RF antenna filter. Another problem related to carrier leakage is that the transmitter may fail modulation spectral emission requirements as imposed on transceivers by a standard, e.g., the FCC requirements for transceivers operating in the 2.4 GHz ISM band. Particularly, when the carrier leakage falls in adjacent channels of such an ISM band, due to a largely reduced spectral emission headroom by the modulation spectrum, the latter problem may be quite significant.

SUMMARY OF THE INVENTION

It is an object of the invention to provide a transceiver not needing an RF power detector that measures the output power of a transmitter, to calibrate the transmitter part of the transceiver.

It is another object to calibrate a transmitter in a transceiver such that the transceiver fulfills emission requirements as defined in standards, such as the 2.4 GHz standard for the ISM band.

It is another object of the invention to provide a transceiver virtually only using components of a standard transceiver to calibrate the transmitter part of the transceiver.

It is still another object of the invention, during calibration of the transmitter, after DC-nulling of the receiver, to calibrate the transmitter on the basis of measured DC-errors induced in the receiver by the transmitter, relative to a DC-nulling reference determined during DC-nulling.

It is still another object of the invention to provide a transceiver wherein, in addition to carrier leakage compensation, also imbalances in the transmitter digital-to-analog converters, that provide transmit signals, are compensated.

In accordance with the invention, a transceiver is provided comprising:
- a transmitter; a receiver, said receiver comprising a DC-nuller providing a nulling-output;
- a common local oscillator coupled to said transmitter and said received;
- a storage; and
- a controller that is coupled to said transmitter and to said receiver,
- said controller being configured to control said DC-nuller, with said transmitter switched off and said receiver switched on, to obtain as a DC-nulling reference a value of said nulling-output that is equal to a setpoint, to store into said storage said DC-nulling reference, and to freeze said nulling-output to said setpoint,
- said controller further being configured to inject a DC-signal into said transmitter, with said transmitter switched on, to modify said injected DC-signal until said frozen nulling output is equal to said stored DC-nulling reference, and to store said injected DC-signal into said storage.

Preferably, a feedback or servo loop is used in AC-couplers of the receiver to perform the DC-nulling, while the transmitter is switched off. After DC-nulling of the receiver, and storage of the determined reference, the transmitter is switched on to perform calibration via the receiver. The servo has an analog storage to freeze the DC-nulling state determined with the transmitter switched off.

Preferably, during injection of the DC-signals in the I and Q paths of the transmitter, between first mixers output a low IF signal and second, RF mixers, for instance, a single tone modulation signal is inputted to the modulator inputs. Then, an average value of the nulling-output is measured. Herewith, advantageously, in addition to carrier leakage compensation, also imbalances in the transmitter digital-to-analog converters, that provide transmit signals, are compensated.

Preferably, the receiver is a quadrature receiver and the transmitter is a quadrature transmitter.

In order to avoid that the calibration is disturbed by signals picked up by an antenna, a receiver in a transceiver with an antenna is isolated from the antenna.

The calibration of the invention can advantageously be done in zero-IF and low-IF transceivers, a zero-IF carrier leakage manifesting itself in the middle of the desired transmit band, and at low-IF carrier leakage still being in the desired transmit band.

BRIEF DESCRIPTION OF THE DRAWING

Throughout the figures the same reference numerals are used for the same features.

DESCRIPTION OF THE DETAILED EMBODIMENTS

Figure 1:
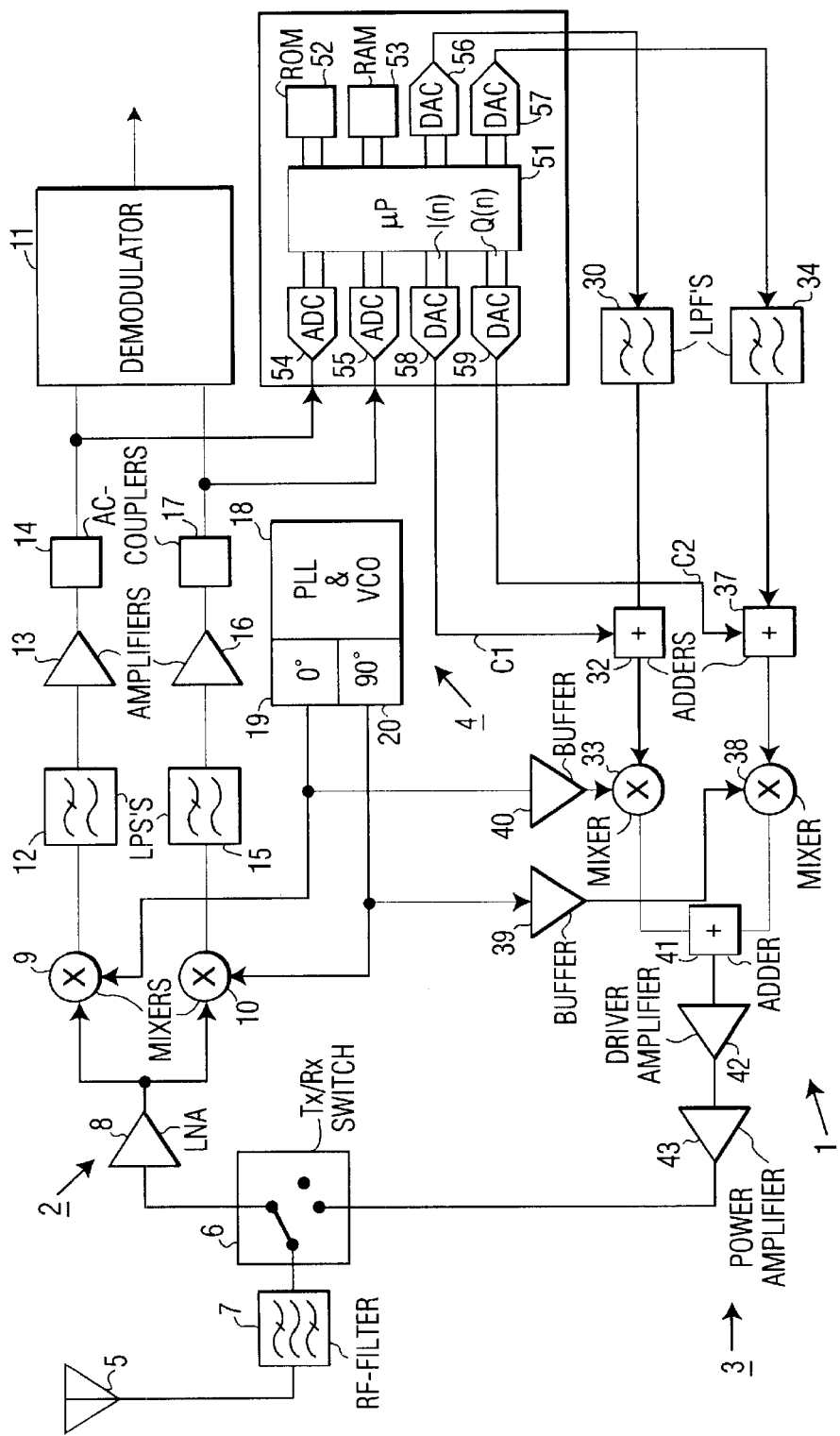
FIG. 1 is a block diagram of a first embodiment of a transceiver according to the present invention.

FIG. 1 is a block diagram of a first embodiment of a transceiver 1 according to the present invention. The transceiver 1 comprises a receiver 2, a transmitter 3, and a local oscillator 4. The receiver 2 and the transmitter 3 are coupled to an antenna 5 via a transmit/receive switch 6 and an RF-filter 7. The receiver 2 comprises a low-noise amplifier (LNA) 8 that is coupled to a mixer 9 in an in-phase branch and to a mixer 10 in a quadrature branch. The mixer 9 is coupled to a demodulator 11 via a low pass filter (LPF) 12, an amplifier 13, and an AC-coupler 14. The mixer 10 is coupled to the demodulator 11 via a low-pass filter 15, an amplifier 16, and an AC-coupler 17. In accordance with the invention, the AC-couplers 14 and 17 comprise servo or feedback loops that perform DC-nulling of the receiver 2 and that provide a reference signal for calibrating the transmitter 3. As is well-known in the art, the common local oscillator 4 comprises a phase locked loop (PLL) and voltage controlled oscillator (VCO) 18, an output of the VCO being coupled to phase shifters that have relative phase shift of 90° with respect to each other, schematically indicated with 0° and 90° in phase shifters 19 and 20. Outputs of the phase shifters 19 and 20 are coupled to the mixers 9 and 10, respectively. The transmitter 3 comprises an in-phase and a quadrature branch. The in-phase branch comprises a low-pass filter 30, an adder 32, and a mixer 33. The adder 32 injects a DC-signal C1 into the in-phase branch of the transmitter 3, between the low-pass filter 30 and the mixer 33. The quadrature branch comprises a low-pass filter 34, an adder 37, and a mixer 38. The adder 37 injects a DC-signal C2 into the in-phase branch of the transmitter 3, between the low-pass filter 34 and the mixer 38. Output signals of the respective phase shifters 19 and 20, that provide quadrature local oscillator signals, are supplied to inputs of the respective mixers 33 and 38 via buffer amplifiers 39 and 40. Outputs of the respective mixers 33 and 38 are supplied to an adder 41 that is coupled to the Tx/Rx-switch via a driver amplifier 42 and a power amplifier 43. The transceiver 1 further comprises a base band circuit 50. The base band circuit 50 comprises a controller in the form of a microprocessor (μP), a ROM 52, and a RAM 53. The ROM 52, e.g. an EEPROM, or any other suitable ROM, is programmed to control the operation of the transceiver 1, and further comprises non-volatile data. The RAM 53 comprises volatile data. The base band circuit 50 further comprises analog-to-digital converters (ADC) 54 and 55 for sampling output signals at the AC-couplers 14 and 17, digital-to-analog converters (DAC) 56 and 57 for providing quadrature zero intermediate or low intermediate frequency modulation signals to the respective low-pass filters 30 and 34, and digital-to-analog converters 58 and 59 that provide the DC-injection signals C1 and C2. The DAC 58 converts a digital signal I(n) into the analog DC-signal C1, and the DAC 59 converts a digital signal Q(n) into the analog DC-signal C2.

Figure 2:
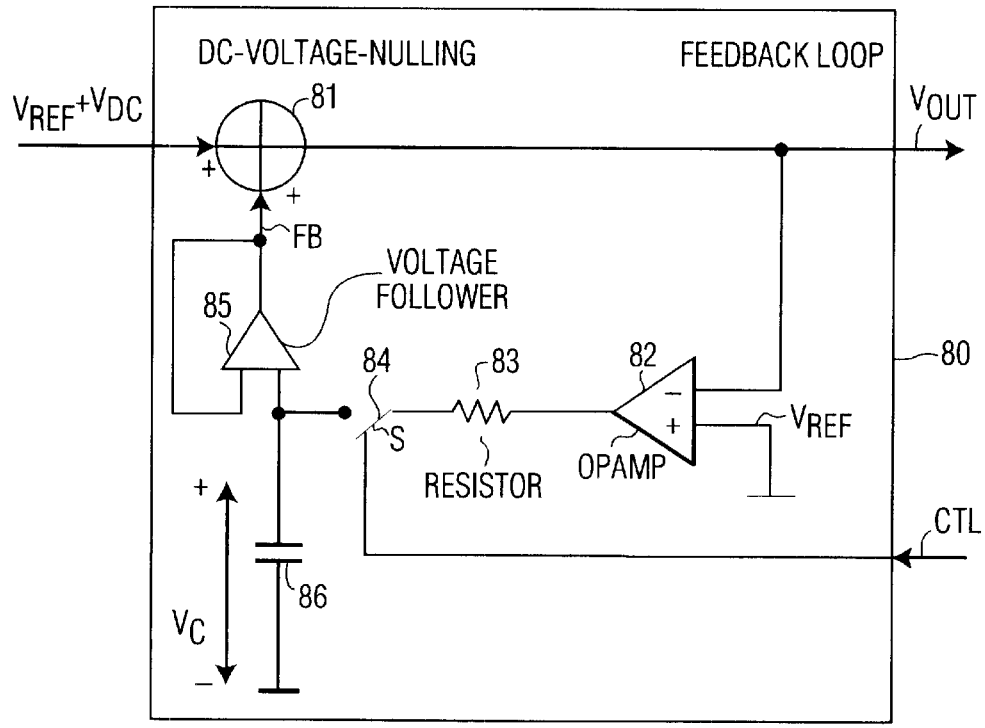
FIG. 2 is a DC-voltage-nulling feedback loop in a receiver branch of a transceiver according to the present invention.

FIG. 2 is a DC-voltage-nulling feedback loop or servo 80 in the receiver branch of the transceiver 1 according to the present invention, comprised in the AC-couplers 14 and 17. The same loop is present in the respective I- and Q-branches of the receiver branch. The loop 80 comprises an adder 81 that, depending on the loop 80 being comprised in the AC-coupler 14 or 17, adds an output signal of the amplifier 13 or the amplifier 16, to a feedback signal FB generated by the loop 80. The loop 80 generates an output signal $V_{OUT}$. The loop 80 further comprises an operational amplifier 82 to which the output signal $V_{OUT}$ and a reference signal $V_{REF}$ are inputted, a resistor 83, a switch 84, a voltage follower 85 that provides the signal FB. The reference signal $V_{REF}$ is a ground signal, for instance. A capacitor 86 is provided that is coupled between an input of the voltage follower 85 and ground, the capacitor 86 being an analog storage for freezing a DC-error signal $V_{DC}$ induced into the receiver 2 during DC-nulling of the receiver 2, with the transmitter 3 switched-off and the receiver 2 isolated from the antenna 5 by putting the Tx/Rx-switch 6 in a position where it is neither connected to the receiver 2 nor to the transmitter 3. Freezing is done after switching-on of the receiver 2, with the transmitter 3 switched-off, and after the loop 80 has settled. Before freezing, the switch 84 is closed. After settling of the loop 80 the switch 84 is opened so as to freeze the loop 80. A control signal CTL controls the switch 84 to open or close. Upon freezing, a voltage $V_C$ across the capacitor 86 is equal to $-V_{DC}$ and the output signal $V_{OUT}$ is equal to $V_{REF}$. For both the in-phase and quadrature branches of the receiver 2, a frozen output signal $V_{OUT}$ is sampled by means of the analog-to-digital converters 54 and 55. For a frequency hopper, such as in the ISM band, a receive band width typically is 1 MHz. Freezing the loop should be done after the loop 80 has settled, and is done, for instance, after a period of 10 times 1/receive-band-width, i.e., after 10 μsec. When calibrating the transmitter after DC-nulling, with the transmitter 3 then switched on, the servo 80 should be permitted to settle in the order of 10 μsec, each time the DC-injection signals C1 and C2 are adjusted or modified. In the shown embodiment of the invention, during calibration, the DACs 56 and 57 provide zero-input signals to the transmitter 3. According to the invention, after DC-nulling, the transmitter is switched on, and the DC-injection signals C1 and C2 are adjusted until the output signal $V_{OUT}$ at the servo loop 80 again is substantially equal to the signal $V_{REF}$. With a worst case 10% carrier leakage, for instance, the DACs 58 and 59 can be 4–5 bit DACs with a DC-cancellation output scale of −0.1 V to +0.1 V, where the DACs 56 and 57 have a full scale of −1.0 V to +1.0 V. The calibration time for 4 bit DACs 58 and 59 then approximately is 16 times 10 μsec is 160 μsec. Thereafter, both in the in-phase and quadrature branch of the receiver 2, the output signal $V_{OUT}$ is sampled by the analog-to-digital converters 54 and 55, and stored by the microprocessor 51.

Figure 3:
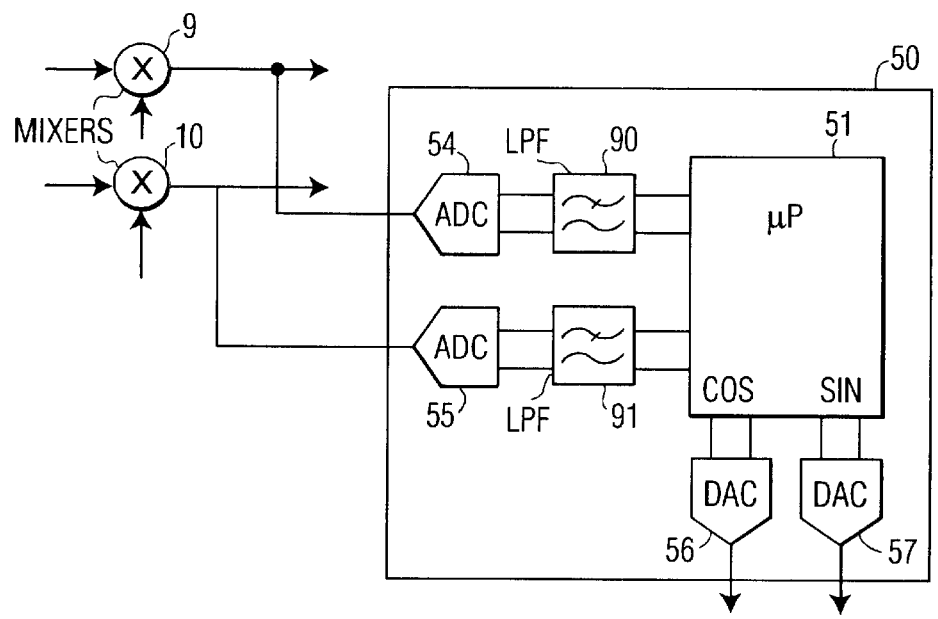
FIG. 3 shows a second embodiment of a transceiver according to the present invention.

FIG. 3 shows a second embodiment of the transceiver 1 according to the present invention in which the DACs 56 and 57 provide a single tone quadrature signal to in-phase and quadrature inputs of the transmitter 3, indicated with COS and SIN. In the second embodiment, the base band circuit 50 comprises digital low-pass filters 90 and 91 that are coupled after the analog-to-digital converters 54 and 55, respectively. Alternatively, the digital low-pass filters 90 and 91 may be implemented as a stored program. Alternatively, analog low-pass filters with succeeding integrators may be used, outputs of the integrators being sampled by the analog-to-digital converters 54 and 55. The low-pass filters 90 and 91 have a cut-off frequency much lower than the 1 MHz receive bandwidth, e.g., a 1 kHz cut-off frequency. In the second embodiment, instead of measuring DC-signal levels, average DC-signal levels are measured by the microprocessor 51. During calibration of the transmitter 3, the signals I(n) and Q(n) are adjusted until the average measured DC-levels are substantially equal to the stored reference signal, e.g., equal to a reference of zero Volt, i.e., practically, until the levels are within a given small voltage band around the reference.

Figure 4:
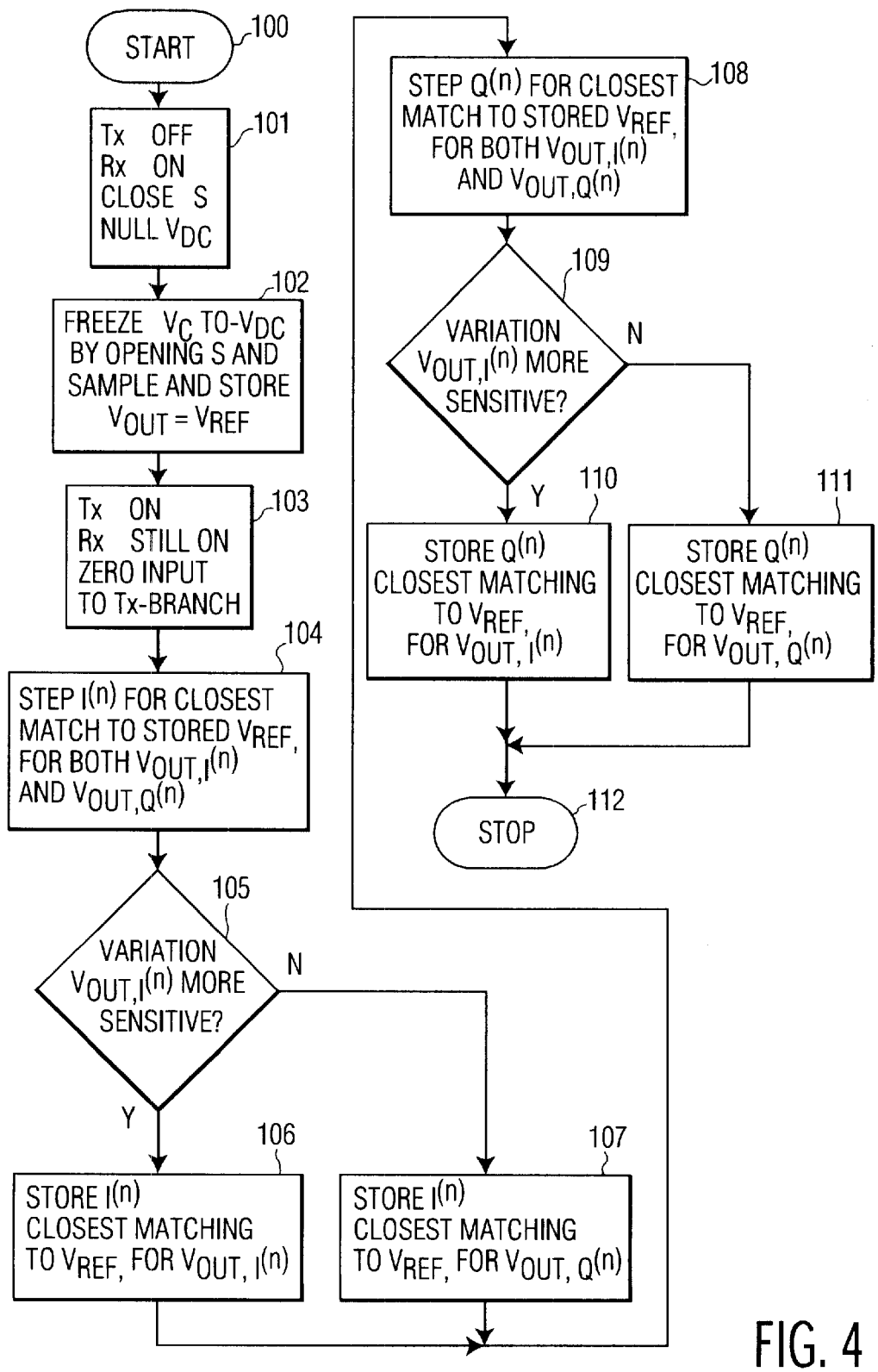
FIG. 4 is flow-chart illustrating the operation of the first embodiment of the transceiver according to the present invention.

FIG. 4 is flow-chart illustrating the operation of the first embodiment of the transceiver according to the present invention. In block 100, the calibration starts. In block 101, the transmitter 3 is switched off, the receiver 2 is switched on, the switch 84 (S) is closed, and the receiver 2 is nulled until the output voltage $V_{OUT}$ of both the I- and Q-branches is equal to the reference voltage $V_{REF}$. In block 102, the switch S is opened so as to freeze the voltage $V_C$ to $-V_{DC}$, the DC-error signal with the transmitter switched off, and the then also frozen output voltage $V_{OUT}=V_{REF}$ is sampled and stored by the microprocessor 51. In block 103, the transmitter 3 is switched on, with the receiver 2 still on, and a zero-input signal to the quadrature inputs of the transmitter 3. In block 104, the microprocessor 51 steps the injection signal I(n) for closest match to the stored reference signal $V_{REF}$, the DACs 58 and 59 stepwise outputting DC-injection signals C1 and C2 in a range or sub-range from the lowest output value to the highest output value of the DACs 58 and 59, and respective output signals of the I- and Q-branches $V_{OUT,I}(n)$ and $V_{OUT,Q}(n)$ being sampled. Stepping may be done in a range or sub-range from the highest output value to the lowest output value of the DACs 58 and 59, or any other suitable way of stepping to find substantial equality of $V_{OUT}$ to the stored $V_{REF}$, e.g., through successively halving the full scale range of the DACs 58 and 59 and checking which half should be chosen in a next halving step. In block 105, the microprocessor 51 tests whether a variation of $V_{OUT,I}(n)$ with the stepped I(n) is much more sensitive than a variation of $V_{OUT,Q}(n)$ with the stepped I(n). If this is the case, in block 106 the microprocessor 51 determines the closest match, within a given small voltage band around the stored reference signal $V_{ref}$, for $V_{OUT,I}(n)$, and stores the value I(n) corresponding to the closest match. If this is not the case, alternatively, in block 107 the microprocessor 51 determines the closest match, within a given small voltage band around the stored reference signal $V_{ref}$, for $V_{OUT,Q}(n)$, and stores the value I(n) corresponding to the closest match. Similarly, in block 108, the microprocessor 51 steps the injection signal Q(n) for closest match to the stored reference signal $V_{REF}$, for both $V_{OUT,I}(n)$ and $V_{OUT,Q}(n)$, and in block 109, the microprocessor 51 checks the sensitivity of the variation of $V_{OUT,I}(n)$ and $V_{OUT,Q}(n)$ with Q(n). In block 110, a value of Q(n) is stored that closest matches the stored $V_{ref}$ for $V_{OUT,I}(n)$. In block 111, a value of Q(n) is stored that closest matches the stored $V_{ref}$ for $V_{OUT,Q}(n)$. The stored values of I(n) and Q(n) are maintained as output values to the DACs 58 and 59. For greater accuracy, the steps from and including the block 104 may be repeated. In block 112, the calibration stops.

In the second embodiment, in the block 103, instead of putting a zero-input signal to the quadrature branches of the transmitter, a single tone quadrature signal is inputted, and sampling and determination of equality is done on the basis of averages of signal levels rather than on the basis of signal levels. This has the advantage that inaccuracies in the DACs 56 and 57, such as signal imbalances, are also compensated for.

When non-volatile memory is available for calibration data, calibration of the transmitter 3 may be done during manufaturing of the transceiver 3, possibly at a number of different temperatures. The manufacturer determined calibration values, at different temperatures may be stored in an a lookup table in non-volatile memory. In addition to the described calibration of the transmitter 3, a further calibration may be done when powering-on the transceiver 1, so as to compensate for big temperature changes. The transceiver 1 may then comprise a temperature sensor that produces a temperature output value that is used to access the lookup table. When only volatile memory is available for storing calibration data, calibration has to be done each time the transceiver 3 is powered on.

In view of the foregoing it will be evident to a person skilled in the art that various modifications may be made within the spirit and the scope of the invention as hereinafter defined by the appended claims and that the invention is thus not limited to the examples provided. The word "comprising" does not exclude the presence of other elements or steps than those listed in a claim.

What is claimed is:

1. A method of calibrating a transmitter of a transceiver that further comprises a receiver, and a common local oscillator for the transmitter and the receiver, said method comprising:

switching off said transmitter and switching on said receiver;

DC-nulling said receiver and storing as a DC-nulling reference a nulling-output of said DC-nulling when said nulling-output is equal to a setpoint;

freezing said nulling-output in said receiver and switching on said transmitter;

injecting a DC-signal into said transmitter and modifying said injected DC-signal until said output is equal to said stored DC-nulling reference; and storing said injected DC-signal as a transmitter calibration signal.

2. A method as claimed in claim 1, comprising setting said transmitter in a non-modulating transmission mode when switching on said transmitter during said calibrating.

3. A method as claimed in claim 2, comprising, upon setting said transmitter in said non-modulating mode, measuring a DC-value of said nulling-output, and injecting said DC-signal until said DC-value is equal to said stored DC-nulling reference.

4. A method as claimed in claim 1, comprising inputting a single tone modulation signal into said transmitter when switching on said transmitter during said calibrating.

5. A method as claimed in claim 4, comprising, upon inputting of said single tone modulation signal, measuring an average value of said nulling-output, and injecting said DC-signal until said average value is equal to said stored DC-nulling reference.

6. A transceiver comprising:

a transmitter;

a receiver, said receiver comprising a DC-nuller providing a nulling-output;

a common local oscillator coupled to said transmitter and said received;

a storage; and a controller that is coupled to said transmitter and to said receiver, said controller being configured to control said DC-nuller, with said transmitter switched off and said receiver switched on, to obtain as a DC-nulling reference a value of said nulling-output that is equal to a setpoint, to store into said storage said DC-nulling reference, and to freeze said nulling-output to said setpoint, said controller further being configured to inject a DC-signal into said transmitter, with said transmitter switched on, to modify said injected DC-signal until said frozen nulling output is equal to said stored DC-nulling reference, and to store said injected DC-signal into said storage.

7. A transceiver as claimed in claim 6, wherein said controller is configured to set said transmitter in a non-modulating transmission mode when switching on said transmitter.

8. A transceiver as claimed in claim 7, wherein said controller, upon setting said transmitter in said non-modulating mode, is configured to measure a DC-value of said nulling-output, and to inject said DC-signal until said DC-value is equal to said stored DC-nulling reference.

9. A transceiver as claimed in claim 6, wherein said controller is configured to input a single tone modulation signal into said transmitter when switching on said transmitter.

10. A transceiver as claimed in claim 9, wherein said controller, upon inputting of said single tone modulation signal, is configured to measure an average value of said nulling-output, and to inject said DC-signal until said average value is equal to said stored DC-nulling reference.

11. A transceiver as claimed in claim 6, further comprising an antenna, said receiver being isolated from said antenna when said controller controls said DC-nuller.

12. A transceiver as claimed in claim 11, wherein said DC-nuller is comprised in an AC-coupler of said receiver, and said DC-nuller comprises a feedback loop with an analog storage, and a switch for interrupting said feedback loop, a DC-error being produced in said receiver with said transmitter being switched off, and said analog storage freezing said DC-error signal upon settling and thereafter interrupting of said feedback loop.

13. A transceiver as claimed in claim 6, wherein said receiver is a quadrature receiver with said DC-nuller in both an in-phase and a quadrature path.

14. A transceiver as claimed in claim 6, wherein said transmitter is a quadrature transmitter, and said controller is configured to inject as said DC-signal an in-phase DC-signal into an in-phase path of said transmitter and a quadrature DC-signal into a quadrature path of said transmitter.

15. A transceiver as claimed in claim 6, wherein said transceiver is a low-IF transceiver.

16. A transceiver as claimed in claim 6, wherein said transceiver is a zero-IF transceiver.

17. A transceiver as claimed in claim 12, wherein said receiver is a quadrature receiver with said DC-nuller in both an in-phase and a quadrature path, said transmitter is a quadrature transmitter, and said controller is configured to inject as said DC-signal an in-phase DC-signal into an in-phase path of said transmitter and a quadrature DC-signal into a quadrature path of said transmitter.

18. A transceiver as claimed in claim 17, wherein said transceiver is a low-IF transceiver.

19. A transceiver as claimed in claim 17, wherein said transceiver is a zero-IF transceiver.

* * * * *